United States Patent [19]
Gilmer et al.

[11] 4,242,636
[45] Dec. 30, 1980

[54] DIGITAL OPERATE/RELEASE TIMER

[75] Inventors: John L. Gilmer, Falls Church, Va.; Joseph F. Rizzo, Lodi, N.J.

[73] Assignee: Bell Telephone Laboratories, Incorporated, Murray Hill, N.J.

[21] Appl. No.: 954,179

[22] Filed: Oct. 24, 1978

[51] Int. Cl.³ .................... H03K 5/20; H04G 1/36; H04K 1/17

[52] U.S. Cl. .................... 328/63; 307/265; 307/293; 328/129; 179/16 E

[58] Field of Search .................. 307/293, 265; 308/37, 308/63, 55, 127, 33; 364/7; 179/16 E, 16 ED, 16 EC

[56] References Cited

U.S. PATENT DOCUMENTS

| | | | |
|---|---|---|---|
| 3,671,875 | 6/1972 | Pento | 179/16 E |
| 3,700,821 | 10/1972 | Savage | 179/16 E |
| 3,889,197 | 6/1975 | Duff | 328/55 |
| 3,980,960 | 9/1976 | Hutchinson | 328/127 |
| 4,001,698 | 1/1977 | Allfed | 328/55 |
| 4,075,569 | 2/1978 | Wright | 179/16 EA |

*Primary Examiner*—Stanley D. Miller, Jr.
*Assistant Examiner*—B. P. Davis
*Attorney, Agent, or Firm*—Thomas Stafford

[57] ABSTRACT

Operate/release timing circuits are employed to generate time delayed pulse signals, for example, dial pulses, wink signals and other supervisory signals employed in telecommunications signaling systems. Pulse position and pulse width errors and other problems found in prior operate/release timers are resolved by employing a single digital counter and associated control logic elements. The timing circuit is controllably configured into several timer circuit arrangements including an integrating timer, AM timer, integrating timer including coast option, and AM timer including coast option. With the coast option enabled, initial noise immunity in the pulse signal is realized by resetting the counter to an initial state in response to any discontinuity in the input pulse signal until the input pulse signal is continuously present for a predetermined interval. Pulse break, gap and the like immunity is achieved by controlling the counter to count up for a predetermined interval regardless of the presence or absence of the input pulse signal. Once a valid input pulse has been detected and is terminated a timer output change of state is delayed for a so-called release delay interval. Once the pulse signal has terminated for a predetermined integrated interval the counter is controlled to continue counting down until the initial condition is reached regardless of the presence or absence of the input pulse signal. When the AM timer option is enabled the release interval is shortened by controllably resetting the counter to the initial condition upon the counter reaching the predetermined integrated interval.

9 Claims, 1 Drawing Figure

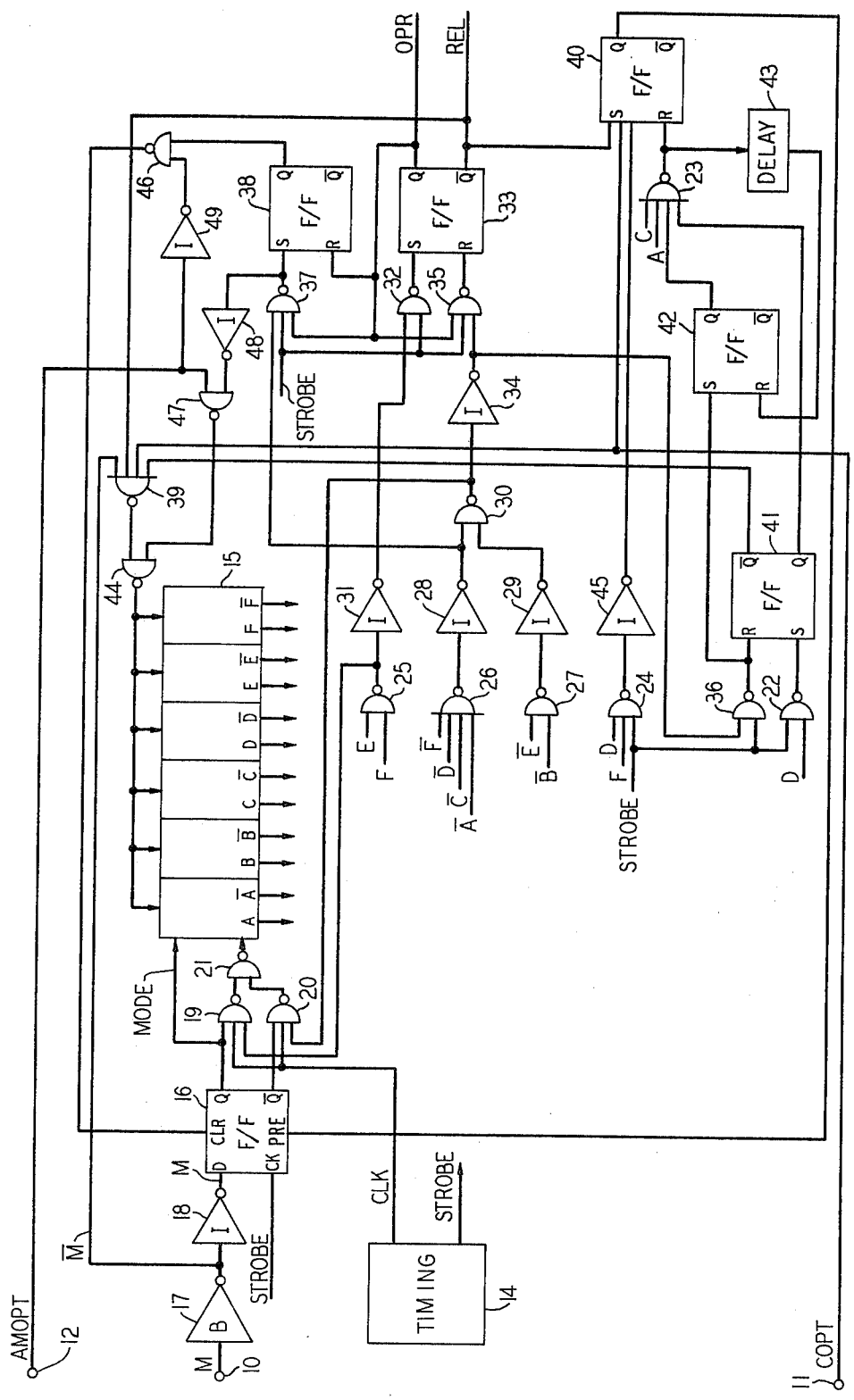

DIGITAL OPERATE/RELEASE TIMER

CROSS-REFERENCE TO RELATED APPLICATION

U.S. Patent Application entitled "Minimum Break/Make Pulse Corrector", Ser. No. 954,180, was filed on Oct. 24, 1978 in the U.S. Patent and Trademark Office concurrently herewith.

TECHNICAL FIELD

This invention relates to electronic timing circuits and, more particularly, to pulse generation circuits for providing output pulse signals which occur some predetermined time interval after the application of an input pulse signal.

BACKGROUND OF THE INVENTION

There are numerous applications in which it is either necessary or desirable to delay an applied pulse signal. For example, in circuits which perform a plurality of operations in a predetermined time sequence in response to a single input pulse signal, a plurality of timer circuits has heretofore most often been utilized to insure that each operation occurs at a predetermined time interval after changes of state in the input pulse signal. In many applications it is also necessary, in addition to delaying operation of a function, to delay termination of that function. For example, it may be necessary to delay initiating a particular function, i.e., enabling or operating a relay or the like for a predetermined interval after application of an input pulse signal and also to delay terminating a circuit function, i.e., disabling or releasing the relay by a similar or different predetermined time interval after the input pulse signal has terminated. The initiation and termination delay intervals are commonly referred to as operate and release intervals, respectively.

Many circuits are known which introduce time delays to applied pulse signals. These circuits vary in complexity from the simple monostable multivibrator to more complex circuit arrangements for precisely generating a plurality of delayed pulse signals. In applications requiring both operate and release delay intervals it has been common practice to employ a separate timer for generating each of the desired delay intervals. Consequently, both circuit complexity and cost are increased. Another limitation of many known timer circuits is the inability to maintain the desired timing sequence when the applied input pulse signal is momentarily interrupted because of spurious discontinuities, i.e., noise, gaps or the like.

One analog time circuit which has been advantageously employed to overcome limitations of prior analog timers is disclosed in U.S. Pat. No. 3,889,197, issued to T. G. Duff on June 10, 1975. This prior timer employs an operational amplifier integrator circuit and a voltage comparator circuit to obtain desired operate and release delay intervals. Basically, the integrator integrates an applied input pulse signal while the comparator detects the voltage at a prescribed circuit point of the integrator to determine when the integrator has reached a saturation point. Desired time delays are obtained by setting the integrator time constant to yield a corresponding integration rate. Some degree of insensitivity to spurious discontinuities in the input signal is obtained by employing similar integration rates for both positive and negative input signals. However, in applications where the release time must be substantially shorter than the operate time, the release integration rate, i.e., response to a negative input, must be substantially shorter than the operate integration rate, i.e., response to a positive input. Consequently, when gaps are present in the input signal, the integrator may repetitively return to its initial condition thereby causing pulse width and pulse position errors in the timer output. Indeed, in many instances the integrator may not reach saturation, thereby not yielding any indication of the presence of input pulse signals.

One analog time circuit which overcomes some of the limitations of the prior Duff circuit is disclosed in U.S. Pat. No. 4,001,698 issued to R. R. Allred on Jan 4, 1977. The circuit disclosed in the Allred patent is an improvement over the prior Duff timer. In the Allred timer, the effects of gaps and the like in an input pulse signal are minimized by advantageously varying the integrator integration in accordance with signals generated internal to the timer circuit. Specifically, the discharge time constant, i.e., negative integration rate, is controlled to be a significantly longer time constant during the so-called operate timing interval. Consequently, the integrator is somewhat inhibited from returning to its initial condition because of gaps or the like in the applied input signal while still having a relatively short release time.

Although the prior known analog timer circuits may perform satisfactorily in numerous applications, they still employ standard resistor-capacitor (RC) timing arrangements requiring the use of capacitors and the like which are undesirable for certain integrated circuit implementations. Moreover, the integrator circuits are still responsive to the applied input signal and gaps therein which may cause undue pulse width and pulse position errors in the resulting output pulse signal. Furthermore, with the advent of large-scale integration it now becomes highly desirable to implement the operate/release timing functions utilizing digital techniques.

One prior known operate/release timer which is implemented by employing digital circuit techniques is disclosed in U.S. Pat. No. 3,700,821 issued to B. R. Savage on Oct. 24, 1972. The Savage arrangement employs two digital up/down counters and associated logic elements to obtain desired operate and release intervals. Specifically, the operate timer employs a digital up/down counter which is essentially the equivalent of an analog integrator. That is to say, the counter counts up, i.e., integrates in a first or positive sense in response to a pulse signal being present, for example, a high state input representative of a logical "1", and counts down, i.e., integrates in a second or negative sense in response to the pulse signal being absent, for example, a low state input representative of a logical "0". The counter must reach a predetermined count before an output pulse is generated. Once the input pulse signal is terminated the release counter begins counting to determine the release interval. Upon the release counter reaching a predetermined count, the operate timer is cleared to its initial condition. Since in the Savage circuit both the operate and release time functions are realized by employing up/down counters which are essentially integrators they too respond to momentary discontinuities in the applied pulse signal. Consequently, pulse position and pulse width errors result in the output pulse signal when gaps, breaks and the like appear in the applied input pulse signals. Additionally, the use of two counter circuits and associated logic to realize the operate and release timer functions requires undue duplication resulting in inefficient use of circuit components.

Furthermore, all of the known prior analog and digital timer circuit arrangements have been designed for specific applications. That is, the circuit component values and logic arrangements are fixed by design for a given application and are not readily alterable. Thus, a circuit change is required when employing the prior arrangements in different applications. This, in turn, requires maintenance of a larger inventory of both replacement and new parts, which is undesirable from an economic standpoint.

SUMMARY OF THE INVENTION

Pulse position and pulse width errors and other problems of the known prior delay timer circuit arrangements are overcome in a digital timer arrangement by employing an integrator and associated control circuitry. The timer circuit generates desired operate and release delay intervals by controllably responding to the presence of an input pulse signal to integrate in a first sense and to the absence of an input pulse signal to integrate in a second sense.

Pulse position and pulse width errors are minimized, in accordance with one aspect of the invention, by advantageously controlling the timer circuit to integrate in the first sense for a predetermined interval of the operate delay interval during which it has been determined breaks, gaps and the like are most likely to occur in the supplied input pulse signal. Integration for this predetermined interval continues regardless of the presence or absence of the input pulse signal.

Similarly, once a valid input pulse signal has been detected and has subsequently been terminated for a predetermined integrated interval, the timer circuit is controlled, in accordance with another aspect of the invention, to integrate in the second sense regardless of the presence or absence of the supplied pulse signal until a prescribed integrator output is attained. Consequently, a release delay interval of at least a prescribed duration is generated once the valid input pulse has terminated for a predetermined integrated interval.

In accordance with another aspect of the invention, the timer circuit arrangement responds to a supplied control signal controllably to alter the duration of the release delay interval. Similarly, the timer is responsive to another supplied control signal to enable or disable the control circuitry which controls the timer to integrate in the first sense for the predetermined interval of the operate delay interval. When this function is disabled, the timer operates as a simple integrating timer.

In accordance with still another aspect of the invention, the timer circuit is controlled to reset to an initial condition in response to discontinuities in the input pulse signal until the input pulse signal is continuously present for a predetermined interval. That is to say, the timer reverts to the initial condition in response to each discontinuity in the input pulse until a predetermined integrator output is reached.

BRIEF DESCRIPTION OF THE DRAWING

These and other objects and advantages of the invention will be more fully understood from the following detailed description of an illustrative embodiment thereof taken in connection with the appended drawing which depicts in simplified block diagram form apparatus illustrating the invention.

DETAILED DESCRIPTION

At the outset it should be noted that all of the circuit elements employed in this embodiment of the invention may be any of the numerous flip-flop and gate arrangements known in the art. Preferably, logic elements are employed which lend themselves to fabrication in integrated injection logic ($I^2L$) so that economies of large-scale integration may be realized.

The FIGURE shows in simplified form one embodiment of a so-called operate/release timer illustrating the invention.

Accordingly, pulse signals, for example, dial pulses, wink signals and the like employed in telecommunication systems as supervisory signals are supplied via M-lead input terminal 10. Additionally, in accordance with an aspect of the invention, this embodiment is controllably configured into several optional timer arrangements by control signals supplied via COPT input terminal 11 and AMOPT input terminal 12. The several timer arrangements are integrating timer, COPT and AMOPT disabled; coast option, COPT enabled and AMOPT disabled; AM timer, COPT disabled and AMOPT enabled; and AM timer with coast option, both COPT and AMOPT enabled. COPT and AMOPT are enabled when a high state signal representative of a logical "1" is supplied to the appropriate terminals and are disabled when a low state signal representative of a logical "0" is supplied to the appropriate terminals.

When operating as an integrating timer this embodiment responds to the presence of an M-lead input signal, for example, a high state signal to integrate in a first sense, i.e., count up, and to the absence of the M-lead input signal, for example, a low state signal to integrate in a second sense, i.e., count down. When a predetermined maximum integrator output is reached, a change of state in the timer output is generated indicative of reception of a valid M-lead input pulse signal. The interval between the initial reception of an M-lead pulse signal and the timer output change of state is designated the operate delay interval. When a valid received M-lead signal is terminated the timer responds to the absence or presence of the M-lead signal to integrate in the second sense or the first sense, respectively, until a predetermined minimum integrator output is reached. Upon reaching the minimum integrator output the timer output again changes state reverting to its initial output condition. The interval from termination of the M-lead input after detection of a valid input pulse until the minimum integrator output is reached is designated the release delay interval. Thus, operation and release of a function are delayed by prescribed integrated intervals. However, in accordance with one aspect of this invention, the subject timer is controlled to continue integrating in the second sense once a prescribed integrator output is reached after termination of a valid M-lead input signal, regardless of the presence or absence of the M-lead input signal, until the minimum integrator output is reached.

When configured as an AM timer, operation of this embodiment is the same as for the integrating timer, except the release interval is controllably shortened. This is realized by resetting the timer to its initial condition once the timer reaches the prescribed integrator output after termination of a valid input signal.

When the coast option is employed, several timing modes are enabled. The coast option can also be enabled when the AM option is enabled. The only difference in operation is the duration of the release interval as described above for AM operation. In the coast configuration the timer operates to reset to its initial condition until the M-lead input signal is continuously present for a first predetermined interval as indicated by reaching a first integrator output. This provides initial noise immunity. Then, the timer operates as an integrating timer until a second integrator output is reached or the timer reverts to its initial condition. Once the timer reaches the second integrator output, it is controlled in accordance with an aspect of the invention to integrate in the first sense regardless of the presence or absence of the input pulse for a predetermined interval indicated by reaching a third integrator output. This minimizes pulse width and pulse position errors caused by gaps, breaks and the like in the M-lead input pulse signal. Upon reaching the third integrator output the timer operates as an integrating timer until a predetermined maximum integrator output is reached thereby indicating reception of a valid M-lead input pulse signal or the timer reverts to its initial condition. Once the valid M-lead input pulse signal is terminated, the timer operates as an integrating timer as described above. Thus, when the coast option is enabled the operate delay interval is controlled to provide initial noise immunity and to provide intermediate pulse gap and break immunity. Consequently, generation of erroneous pulse signals because of noise and generation of pulse width and pulse position errors because of gaps and breaks are minimized.

Referring again to the FIGURE, the several timer configurations are controllably realized by employing a control logic arrangement and up/down digital counter 15. The control logic is responsive to control signals COPT and AMOPT supplied via terminals 11 and 12, respectively, to configure the timer into the desired arrangements and to pulse signals supplied via M-lead terminal 10 for controlling the supply of timing signals CLK from timer 14 to counter 15.

Timing signals CLK and STROBE are generated in well-known fashion in timing generator 14. Any of numerous circuit arrangements known in the art may be employed to generate these timing signals. Preferably, signals CLK and STROBE are derived from a signal employed in single frequency inband signaling systems used in telecommunications systems, namely, the 2600 Hz tone. In this example, signal STROBE is initiated a short interval before signal CLK, both at 2600 Hz. This is achieved by employing a number of NAND gates connected in series as inverters (not shown). Consequently, signal CLK is delayed by the propagation delay of the serial connection of gates. In this example, signal STROBE is employed to insure that initiation of certain circuit functions occur simultaneously thereby avoiding race problems and the like.

Counter 15 is a 6-stage up/down counter having output A, $\overline{A}$, B, $\overline{B}$, C, $\overline{C}$, D, $\overline{D}$, E, $\overline{E}$, F and $\overline{F}$, and is responsive to a high state MODE signal to count up and to a low state MODE signal to count down. Counter 15 in conjunction with the control logic arrangement for supplying signal CLK thereto is essentially the equivalent of an analog integrator circuit. Thus, when the counter is counting up it is integrating in a first sense the equivalent of positive integration of an analog timer, and when it is counting down it is integrating in a second sense the equivalent of negative integration of an analog timer.

The supply of timing signal CLK to counter 15 is primarily controlled by D-type flip-flop 16 and NAND gates 19, 20 and 21 in response to the state of applied pulse signal M supplied via M-lead input terminal 10, buffer inverter 17 and inverter 18, and to control signals from others of the control logic elements as described below. D-type flip-flop 16 generates signals at outputs Q and $\overline{Q}$ to control the supply of signal CLK and the counting mode of counter 15. Operation of D-type flip-flop circuits is now well known in the art. Normally, a signal is generated at output Q having the same state as that supplied to input D in response to a STROBE signal supplied to input CK provided that the flip-flop is not in the preset or clear modes, i.e., high state signals are supplied to PRE and CLR. The complement of the signal generated at output Q is generated at output $\overline{Q}$. When a low state signal is supplied to input PRE (preset) a high state signal is generated at output Q regardless of the state of the signal supplied to input D. A low state signal applied to input CLR (clear) clears the flip-flop to an initial condition of low state signal at output Q. A low state at output Q subsists while the low state signal is applied to input CLR.

Output Q from flip-flop 16 is supplied to one input of NAND gate 19 and, as the MODE signal, to the up/down input of counter 15. Output $\overline{Q}$ of flip-flop 16 is supplied to one input of NAND gate 20. Outputs Q and $\overline{Q}$, therefore, are employed to enable NAND gates 19 and 20, respectively, for supplying signal CLK via NAND gate 21 to counter 15. Thus, when output Q of flip-flop 16 is in a high state counter 15 is enabled to count up at a rate determined by signal CLK and when output $\overline{Q}$ of flip-flop 16 is in a high state counter 15 is enabled to count down at the CLK signal rate. The remaining inputs to NAND gates 19 and 20 are employed to disable those gates upon the counter attaining prescribed count states. Specifically, the remaining input to NAND gate 19 disables gate 19 upon counter 15 reaching a predetermined maximum up count, while the remaining input to NAND gate 20 disables that gate upon counter 15 reaching a predetermined minimum down count state, namely, the initial condition of zero count. Thus, counter 15 is inhibited from counting above a predetermined maximum up count and from counting below a predetermined minimum down count.

Outputs from counter 15 are supplied to a plurality of detector gate arrangements in order to detect desired time intervals. Specifically, output D is supplied to NAND gate 22 for detecting when counter 15 attains a first predetermined count representative of a predetermined integrator output, in this example, a count of 8, corresponding to approximately 3 milliseconds; outputs A and C are supplied to NAND gate 23 for detecting a second predetermined count representative of a predetermined integrator output, in this example, a count of 13, corresponding to approximately 5 milliseconds; outputs D and F are supplied to NAND gate 24 for detecting a third predetermined count representative of a predetermined integrator output, in this example, a count of 40, corresponding to approximately 15.5 milliseconds; outputs E and F are supplied to NAND gate 25 for detecting a fourth predetermined count, representative of a predetermined integrator output, in this example, a count of 48, corresponding to approximately 18.5 milliseconds; outputs $\overline{A}$, $\overline{C}$, $\overline{D}$ and $\overline{F}$ are supplied to NAND gate 26 for detecting a fifth predetermined count, representative of a predetermined integrator output, for example a count of 18, corresponding to approximately 11.5 milliseconds from the maximum count of 48; outputs $\overline{B}$ and $\overline{E}$ are supplied to NAND gate 27 for detecting, in conjunction with NAND gate 26, an initial count condition of counter 15 representative of a predetermined integrator output, in this example, zero. Thus, in effect, NAND gates 26 and 27, in conjunction with inverters 28 and 29 and NAND gate 30, form a zero count detector.

NAND gate 25 yields a change in state, i.e., high to low, upon counter 15 reaching a predetermined maximum count as indicated above. The output from NAND gate 25 is supplied to an input of NAND gate 19 for disabling or otherwise inhibiting NAND gate 19 upon counter 15 reaching the maximum count, in this example 48. This prevents counter 15 from counting up beyond the desired maximum count of 48 thereby assuring a fixed reference for initiation of the release delay interval.

The output from NAND gate 25 is also supplied via inverter 31 to one input of NAND gate 32. Signal STROBE from timing circuit 14 is supplied to a second input of NAND gate 32. Consequently, when both inputs to NAND gate 32 are high a low state output is generated which is supplied to the set (S) input of flip-flop 33. Therefore, flip-flop 33 is set to generate a high state at output Q (OPR) upon counter 15 reaching the maximum count of 48 thereby indicating reception of a valid M-lead input pulse signal.

NAND gate 30 yields a change in state, i.e., high to low, upon counter 15 reaching the predetermined minimum count, for example, a count of zero representative of the initial timer condition. The output from NAND gate 30 is supplied to an input of NAND gate 20 for disabling or otherwise inhibiting NAND gate 20 upon counter 15 reaching the desired minimum count of zero. This prevents counter 15 from counting down below the minimum count of zero and assures a fixed reference for initiation of the operate delay interval.

Additionally, the output from NAND gate 30 is supplied via inverter 34 to one input of NAND gate 35 and to one input of NAND gate 36 thereby controllably enabling those gates.

Flip-flop 33 is designated the operate/release control flip-flop. Signals generated at output Q of flip-flop 33 are representative of the so-called operate (OPR) interval of the M-lead pulse signal supplied to terminal 10. Similarly, signals generated at output $\overline{Q}$ of flip-flop 33 are representative of the so-called release (REL) interval of the M-lead pulse signal. The operate and release intervals are indicated by a high state signal being present at outputs Q and $\overline{Q}$, respectively, of flip-flop 33. Outputs OPR and REL are employed as desired. Output Q of flip-flop 33 is supplied to inputs of NAND gates 35 and 37 and to reset (R) input of flip-flop 38. Consequently, NAND gates 35 and 37 are enabled only when a high state signal is present at output Q of flip-flop 33 and flip-flop 38 is reset only upon a change of state in output Q (OPR) of flip-flop 33. Output $\overline{Q}$ of flip-flop 33 is supplied to an input of NAND gate 39 and to a set (S) input of flip-flop 40. Thus, gate 39 is enabled and flip-flop 40 is settable only when a high state signal is present at output $\overline{Q}$ (REL) of flip-flop 33.

The timer coast option is controlled primarily by NAND gates 22, 23, 24, 36, 39 and 44, delay 43, flip-flops 16, 33, 40, 41 and 42 and associated outputs of counter 15 and by supplying a high state COPT signal via terminal 11. As indicated above, the coast option when enabled includes, but is not limited to, the functional modes of providing initial noise immunity and intermediate pulse gap, split and break immunity during the operate delay interval.

Initial noise immunity is realized by NAND gate 39 under primary control of flip-flop 41. Specifically, NAND gate 39 controls resetting, i.e., clearing, the stages of counter 15 via NAND gate 44 until the M-lead input signal supplied via terminal 10 is in a high state continuously for a predetermined interval, as indicated by an 8-count being detected by NAND gate 22. A second input to NAND gate 44 is normally high. Additionally, when the coast option is enabled, COPT is at a high state, output $\overline{Q}$ of flip-flop 41 is initially at a high state, and output $\overline{Q}$ from flip-flop 33 is initially at a high state. Therefore, NAND gate 39 is enabled to respond to changes in state of signal $\overline{M}$ supplied via M-lead terminal 10 and buffer inverter 17. Thus, when $\overline{M}$ is a high state (M-lead input is a low state), the output of NAND gate 39 goes low causing the output of NAND gate 44 to go high. In turn, the high output from NAND gate 44 clears all the stages of counter 15 to their initial state, in this example to a count of zero. The interval that NAND gate 39 is enabled is determined by NAND gate 22 and controlled by output $\overline{Q}$ of flip-flop 41. NAND gate 22 is an 8-count detector which, in this example, corresponds to an interval of approximately 3 milliseconds. It has been determined that this interval is of sufficient duration to provide desired initial noise immunity. An output from NAND gate 22 is supplied to the set (S) input of flip-flop 41. Similarly, an output from NAND gate 36 is supplied to the reset (R) input of flip-flop 41 and to the set (S) input of flip-flop 42. Output $\overline{Q}$ of flip-flop 41 is supplied to an input of NAND gate 39 while output Q is supplied to an input of NAND gate 23. Flip-flop 41 is employed for controllably enabling and disabling both NAND gates 39 and 23. Initially, output $\overline{Q}$ of flip-flop 41 is at a high state and output Q is at a low state. Consequently, NAND gate 39 is initially enabled, in part, and NAND gate 23 is initially disabled. Upon counter 15 reaching a count of 8, i.e., output D attaining a high state, NAND gate 22 responds to the next STROBE signal to generate an output change of state from high to low which sets flip-flop 41. Consequently, outputs $\overline{Q}$ and Q of flip-flop 41 are low and high, respectively, and NAND gate 39 is disabled while NAND gate 23 is partially enabled. Thus, NAND gate 39 is enabled to clear the stages of counter 15 via NAND gate 44 only during an initial prescribed interval of the operate delay interval and only when the coast option is enabled via COPT being at a high state.

NAND gate 36 insures that flip-flop 41 is reset to its initial condition of a high state at output $\overline{Q}$ only when counter 15 has been reset or otherwise reaches its initial count condition of zero. Thus, every time counter 15 is cleared or otherwise reset to a count of zero, flip-flop 41 is reset to its initial condition of output $\overline{Q}$ at a high state and NAND gate 39 is again enabled. This insures that once the applied M-lead pulse is continuously present for the prescribed interval, corresponding in this example to a count of 8, counter 15 is not cleared in response to a change of state in a M-lead input pulse until a zero count is reached.

Upon reaching a count of 8, the timer is controlled to operate as an integrating timer, i.e., counter 15 is controlled to count up when M is a high state and to count down when M is a low state. This mode of operation continues until a prescribed integrated output, i.e., count, is attained.

It has been determined that pulse gaps, splits, breaks and the like are most likely to occur during a prescribed interval of the M-lead input pulse signal. Immunity to these undesirable signal characteristics is realized by advantageously controlling D-type flip-flop 16 to generate a high state at output Q for a predetermined interval regardless of the presence or absence of a high state M-lead input. In effect, the timer ignores the input signal for this predetermined interval during which undesired signal characteristics are most likely to occur. This predetermined interval is designated the coast interval and is initiated upon the timer attaining a prescribed integrator output, in this example a count of 13. A count of 13 corresponds to an interval of approximately 5 milliseconds. The coast interval is initiated by outputs Q of flip-flops 41 and 42 being in a high state and counter 15 reaching a count of 13, i.e., outputs A and C being high states. Then, NAND gate 23 generates an output change of state which is supplied to the reset (R) input to flip-flop 40 and via delay 43 to the reset (R) input of flip-flop 42. Flip-flop 42, in conjunction with delay 43, insures that flip-flop 40 is reset only once during the operate delay interval. That is to say, the coast interval is enabled only once when counting toward the maximum up count counter 15 can attain. Thus, flip-flop 42 is set via the output from NAND gate 36 only upon detection of counter 15 reaching its initial integrator output, i.e., a count of zero. Delay 43 is employed to insure that flip-flop 40 is reset prior to NAND gate 23 being disabled via output Q of flip-flop 42. Thus, flip-flop 40 is reset prior to flip-flop 42. When flip-flop 40 is reset, output Q goes low and, in turn, D-type flip-flop 16 is preset to the condition of output Q remaining in a high state regardless of the state of the M-lead signal supplied to input D. Consequently, counter 15 is enabled to count up, i.e., integrate in a first sense, until output Q of flip-flop 40 again changes state to a high state signal. As indicated above, this condition subsists for at least a predetermined interval, designated the coast interval, as determined by counter 15 generating a predetermined integrator output represented, in this example, by a count of 40. NAND gate 24 is a 40-count detector. Thus, when outputs D and F of counter 15 are high and in response to the next STROBE signal, NAND gate 24 generates a low state signal which is inverted to a high state via inverter 45. In turn, the high state signal from inverter 45 is supplied to a set (S) input of flip-flop 40. Since COPT is a high state signal and output $\overline{Q}$ from flip-flop 33 is initially a high state signal, flip-flop 40 is set to its initial condition of output Q being a high state signal. D-type flip-flop 16 is again responsive to changes in state of the M-lead input signal supplied by inverter 18 to the D input.

In this example, the coast interval is the integrator output represented by the difference between a count of 13 and 40, or approximately 10.5 milliseconds.

Once flip-flop 40 is again in its initial condition of output Q being a high state signal, the timer again operates as an integrating timer, i.e., counter 15 counts up or down in response to a high state signal at output Q or output $\overline{Q}$, respectively, of D-type flip-flop 16 until a desired maximum count is detected by NAND gate 25, or until the timer reverts to its initial condition as indicated by a low state output from NAND gate 30. Upon reaching the desired maximum count of 48, as indicated by outputs E and F of counter 15 being high, the output of NAND gate 25 goes low thereby disabling NAND gate 19 and preventing counter 15 from counting up above the count of 48. Additionally, the output from NAND gate 25 is supplied via inverter 31 to enable NAND gate 32. NAND gate 32, in response to the next high state STROBE signal, sets flip-flop 33. Consequently, output Q of flip-flop 33 changes to a high state and output $\overline{Q}$ changes to a low state. Output $\overline{Q}$ of flip-flop 33 disables flip-flop 40 to insure that D-type flip-flop 16 cannot be preset again until the valid M-lead signal has terminated. Output Q is supplied to inputs of NAND gates 35 and 37 and to the reset (R) input of flip-flop 38.

Once a valid M-lead pulse signal has been detected, i.e., the maximum count of 48 has been reached, NAND gate 25 generates a high to low output signal transition, flip-flop 33 is set via inverter 31 and NAND gate 32, in response to the next STROBE signal. Consequently, output Q (OPR) from flip-flop 33 is a high state signal and output $\overline{Q}$ (REL) is a low state signal and NAND gate 35 and NAND gate 37 is partially enabled. This condition of generating a high state signal at output Q of flip-flop 33 subsists until the release delay interval has terminated and corresponds to the so-called break interval of the supplied M-lead input pulse signal. Thereafter, the timer again operates as an integrating timer, i.e., counts up and down in response to high and low states, respectively, of the M-lead input signal.

The release delay interval is controlled primarily by NAND gates 26, 27, 30, 35, 37, 44, 46 and 47, flip-flops 33 and 38 and inverters 28, 29, 34, 48 and 49. As indicated above, the release interval is controllably adjustable in accordance with one aspect of the invention in response to control input AMOPT. First, let us assume that AMOPT is disabled, i.e., a low state signal is applied via input terminal 12. Under this condition, the timer is operating in its so-called normal release delay mode. Thus, the timer operates as an integrating timer, i.e., counts up in response to a high state M-lead input and counts down in response to a low state M-lead input, until a predetermined integrator output is reached, in this example, a count of 18. Counting down from the maximum count, in this example a count of 48, to the count of 18 corresponds to an integrated release interval of approximately 11.5 milliseconds. The count of 18 is detected by NAND gate 26 generating a low state signal when outputs $\overline{A}$, $\overline{B}$, $\overline{C}$, $\overline{D}$ and $\overline{F}$ are all high state signals. The low state signal from NAND gate 26 is supplied via inverter 28 to enable NAND gate 37. Since output $\overline{Q}$ from flip-flop 33 is a high state, NAND gate 37 responds to the next STROBE signal to generate a low state output. In turn, this low state output from NAND gate 37 sets flip-flop 38 to generate a high state signal at output Q. The high state signal from output Q of flip-flop 38 is supplied to enable NAND gate 46. Since AMOPT is a low state signal, the output of inverter 49 is a high state signal and NAND gate 46 generates a low state output which is supplied to input CLR of D-type flip-flop 16. As indicated above, a low state signal supplied to input CLR of flip-flop 16 causes a low state at output Q and a high state at output $\overline{Q}$ regardless of the state of the M-lead input signal supplied to input D. Therefore, counter 15 is controlled to be in the down count mode and NAND gate 20 is enabled to supply signal CLK to the clock input of counter 15. Thus, counter 15 is controlled, in accordance with one aspect of the invention, to integrate in the second sense, i.e., count down, until a predetermined integrator output condition is attained, in this example zero count. Upon counter 15 reaching the zero count, as indicated by outputs $\overline{A}$, $\overline{B}$, $\overline{C}$, $\overline{D}$, $\overline{E}$ and $\overline{F}$ all being high state signals, NAND gate 30 generates a low state signal, as described above, which is supplied to disable NAND gate 20, thereby inhibiting counter 15 from counting below zero. Additionally, the output from NAND gate 30 is supplied via inverter 34 to enable NAND gate 35 and NAND gate 36. In response to the next STROBE pulse NAND gate 35 resets flip-flop 33 to its initial condition, i.e., a low state at output Q and a high state at output $\overline{Q}$, while NAND gate 36 resets flip-flop 41 to its initial condition. Consequently, the timer is reinitiated. Output $\overline{Q}$ (REL) of flip-flop 33 remains in a high state until the next valid M-lead input pulse has been detected. The interval that signal REL is in a high state corresponds to the make interval of the M-lead input.

The functional mode during the release delay interval of controlling the timer to count down to the predetermined initial count condition of zero once an integrated release interval of predetermined duration, in this example approximately 11.5 milliseconds, has beenn reached, is important so that pulse signals which have a so-called make interval of this predetermined duration, i.e., 11.5 milliseconds, are detectable and still generate a release interval of at least a predetermined duration, in this example approximately 18.5 milliseconds.

To configure the timer as an AM timer a high state AMOPT signal is supplied via terminal 12 to an input of NAND gate 47 and via inverter 49 to an input of NAND gate 46. Thus, NAND gate 47 is enabled while NAND gate 46 is disabled. Accordingly, output Q of flip-flop 38 no longer controls operation of input CLR of flip-flop 16. However, NAND gate 47 is enabled and, in response to NAND gate 26 detecting a count of 18 and generating a low state output which is inverted via inverter 28 and, in turn, causes NAND gate 37 to generate a low state output. NAND gate 47 generates a low state signal disabling NAND gate 44. The resulting low to high state output transition from NAND gate 44 clears all the stages of counter 15 to their initial condition of zero count. Therefore, the timer is reset to its initial condition as described above. Consequently, the timing circuit is controlled when operating as an AM timer to generate a shortened release delay interval. This interval is of a predetermined integrated duration, in this example approximately 11.5 milliseconds, regardless of whether or not the M-lead input is in a low or high state.

Thus, in summary, when the timing circuit is operating as an integrating timer, i.e., both COPT and AMOPT supplied to terminals 11 and 12, respectively, are low state signals, and outputs Q (OPR) and $\overline{Q}$ (REL) of flip-flop 33 are initially low and high states, respectively. Upon reception of an M-lead input, i.e., high state signal to terminal 10, counter 15 is controlled as described above to count up in response to the high state input and to count down in response to a low state input until the predetermined maximum integrator output, a count of 48 from counter 15, is detected by NAND gate 25. This corresponds to an integrated operate delay interval, in this example of approximately 18.5 milliseconds. Then, outputs Q (OPR) and $\overline{Q}$ (REL) of flip-flop 33 are high and low states, respectively. This interval is designated the operate interval and corresponds to the so-called break interval of the M-lead input pulse signal. The break interval subsists until the M-lead input is in a low state for a predetermined integrated interval, in this example corresponding to the difference between the maximum up count of 48 and a down count of 18 as detected by NAND gate 26. This interval is approximately 11.5 milliseconds. Then, counter 15 is controlled via flip-flop 16 to count down until the initial condition of zero count is reached. Once the zero count condition is reached, outputs Q and $\overline{Q}$ of flip-flop 33 are reset to their initial low and high states, respectively. This condition subsists until another M-lead input pulse signal is present for at least the 18.5 millisecond interval. This interval is designated the release interval and corresponds to the so-called make interval of the M-lead input. The make interval continues until the next high state M-lead signal is received at terminal 10.

When the AM timer option is enabled by supplying a high state signal to terminal 12, operation is the same as described above for the integrating timer except that the release delay interval is controllably shortened, as described above. To this end, counter 15 is reset upon reaching the down count of 18 via logic circuit elements as described above. Consequently, a shortened release delay interval of at least 11.5 milliseconds is established in this example.

When the coast option is enabled via a high state COPT signal being supplied to terminal 11, counter 15 is controlled initially to reset to a zero count until the M-lead input is continuously in a high state for a predetermined initial interval of approximately 3 milliseconds as detected by NAND gate 22. Then the timer operates as an integrating timer until an integrated interval of approximately 5 milliseconds is reached as detected by NAND gate 23. Thereupon, counter 15 is controlled via flip-flop 16 and associated logic elements, as described above, to count up for a predetermined coast interval in this example, approximately 10.5 milliseconds, as detected by NAND gate 45. Upon termination of the coast interval the timer again operates as an integrating timer until the maximum count of 48, corresponding in this example to an interval of 18.5 milliseconds, is detected by NAND gate 48. Thus, an operate delay interval of at least 18.5 milliseconds is established. Operation thereafter is the same as described above for the integrating timer or AM timer depending upon which option is enabled.

The integrated interval between the initial reset interval and the enabling of the coast interval is selected merely not to extend the initial noise immunity interval for too long a duration and not to initiate the coast interval prematurely. In some applications it may be advantageous to eliminate this interval. Indeed, any or all of the intervals in all of the timer options may be eliminated, lengthened or shortened as desired to meet the needs of the particular application.

We claim:

1. A timing circuit (the FIGURE) of the type employed to generate time delayed output pulse signals (OPR and REL) including an integrator (counter 15) responsive to the presence (high state) of an input pulse signal (M at 10) to integrate in a first sense, for example, a positive sense (count up), and to the absence (low state) of the input pulse signal (M at 10) to integrate in a second sense, for example, a negative sense (count down), for generating an output change of state (OPR high and REL low) upon the integrator output (A-F)

reaching a predetermined threshold value (for example a count of 48), CHARACTERIZED BY, first means (14, 16–24, 33, 40 etc.) responsive to the integrator (counter 15) output (A, C, D, F) reaching a first prescribed value (for example a count of 13) in response to the presence of an input pulse signal (high state M at 10) for controlling (via 16, 19, 21, 40) the integrator (counter 15) to integrate in the first sense (count up) from the first prescribed value toward the predetermined threshold value for a prescribed interval (for example a count of 40) regardless of the presence (high state) or absence (low state) of the input pulse signal (M at 10).

2. A timing circuit (the FIGURE) as defined in claim 1, further including second means (17, 39, 44, etc.) responsive to said input pulse signal (M supplied via 10) for controllably resetting said integrator (for example, to zero count) in response to any discontinuity (high to low transition in M) in said input pulse signal (M); and means (22, 36, 41, etc.) for disabling said second means (via 39) upon said input pulse signal (M) being continuously present (high state) for a predetermined interval (detected via 22).

3. A timing circuit (the FIGURE) as defined in claim 2, further including means (39, 40) responsive to a first control signal (high state COPT supplied via 11) for controllably enabling said first means (via 40) and said second means (via 39).

4. A timing circuit (the FIGURE) as defined in claim 1, further including third means (16, 25–35, 37, 38, 46) responsive to the integrator (counter 15) output reaching a second prescribed value (high state outputs at $\overline{A}$, $\overline{C}$, $\overline{D}$, $\overline{F}$) after generation of a predetermined output signal (OPR high state from 33) for controlling said integrator (counter 15 via 16, 38, 46, etc.) to integrate in the second sense (count down) until a third predetermined integrator output ($\overline{A}$, $\overline{B}$, $\overline{C}$, $\overline{D}$, $\overline{E}$, $\overline{F}$ all high state detected via 26 and 27) is reached regardless of the presence (high state) or absence (low state) of the input pulse signal (M at 10).

5. A timing circuit (the FIGURE) as defined in claim 4, further including means (46, 49) responsive to a second control signal (AMOPT high state) for controllably disabling (via 49 and 46) said third means, and means (37, 47, 48) responsive to said second control signal (AMOPT) and to the integrator (counter 15) outputs reaching said second prescribed value ($\overline{A}$, $\overline{C}$, $\overline{D}$, $\overline{F}$, all high state) for controllably resetting (via 44) said integrator (counter 15) to said third predetermined output ($\overline{A}$, $\overline{B}$, $\overline{C}$, $\overline{D}$, $\overline{E}$, $\overline{F}$ all high state, i.e., zero count).

6. A timing circuit (the FIGURE) as defined in claim 5, wherein said integrator means includes digital up-/down counter means (15); and means (16, 19, 20, 21) for controllably supplying clock pulses (CLK from 14) to said counter means (15).

7. A timing circuit (the FIGURE) as defined in claim 6, wherein said first means includes logic means (23, 39, 40, etc.) controllably enabled by a first control signal (high state COPT) and responsive to predetermined outputs (A and C) from said counter means (15) for controlling said counter means (15) to count up until a first prescribed count (D and F of 15 being high state) is reached, regardless of the presence (high state) or absence (low state) of the input pulse signal (M at 10).

8. A timing circuit (the FIGURE) as defined in claim 7, wherein said first means (14, 16–24, 33, 40, etc.) further includes logic means (23, 36, 42, 43) for insuring that said first means is enabled only once during each operate delay interval to control said counter means (15) to count up until said first prescribed count is reached, regardless of the presence (high state) or absence (low state) of the input pulse signal (M).

9. A timing circuit (the FIGURE) of the type employed to generate delayed output pulse signals (OPR and REL) including an integrator (counter 15) responsive to the presence (high state) of an input pulse signal (M at 10) to integrate in a first sense, for example, a positive sense (count up) and to the absence (low state) of the input pulse signal (M at 10) to integrate in a second sense, for example, a negative sense (count down), for generating an output change of state (OPR high state and REL low state) upon the integrator (counter 15) output (A–F) reaching a predetermined threshold value (for example, a count of 48), CHARACTERIZED BY, control means (16, 20, 25–35, 37, 38, 46, 49) responsive to the integrator (counter 15) output reaching the predetermined threshold value (E and F high state detected via 25) and being responsive then to the integrator (counter 15) output reaching a prescribed value ($\overline{A}$, $\overline{C}$, $\overline{D}$, $\overline{F}$ all high state) for controlling said integrator (via 16, 20) to integrate in the second sense (count down) until a prescribed integrator (counter 15) output condition ($\overline{A}$, $\overline{B}$, $\overline{C}$, $\overline{D}$, $\overline{E}$, $\overline{F}$ all high) is attained regardless of the presence (high state) or absence (low state) of the input pulse signal (M), means (46, 49) responsive to a control signal (AMOPT high state) for controllably disabling said control means, and means (37, 47, 48) responsive to said control signal (AMOPT) and to the integrator (counter 15) outputs reaching said prescribed output value (A, C, D, F all high state) for controllably resetting (via 44) said integrator (counter 15) to said prescribed output condition (A, B, C, D, E, F all high).

* * * * *